(12) United States Patent
Bourdelle et al.

(10) Patent No.: US 7,645,486 B2
(45) Date of Patent: *Jan. 12, 2010

(54) METHOD OF MANUFACTURING A SILICON DIOXIDE LAYER

(75) Inventors: Konstantin Bourdelle, Crolles (FR); Nicolas Daval, Grenoble (FR); Ian Cayrefourcq, Saint Nazaire les Eymes (FR); Steven R. A. Van Aerde, Tielt-Winge (BE); Marinus J. M. De Blank, Heverlee (BE); Cornelius A. Van Der Jeugd, Heverlee (BE)

(73) Assignees: S.O.I. Tec Silicon on Insulator Technologies, Bernin (FR); ASM International N.V., Bilthoven (NL)

( * ) Notice: Subject to any disclaimer, the term of this patent is extended or adjusted under 35 U.S.C. 154(b) by 323 days.

This patent is subject to a terminal disclaimer.

(21) Appl. No.: 11/677,696

(22) Filed: Feb. 22, 2007

(65) Prior Publication Data
US 2007/0134887 A1  Jun. 14, 2007

Related U.S. Application Data

(63) Continuation of application No. PCT/EP2004/011616, filed on Sep. 16, 2004.

(51) Int. Cl.
*C23C 16/40* (2006.01)
(52) U.S. Cl. ............... 427/255.37; 427/294; 427/376.2
(58) Field of Classification Search ......... 427/255.37, 427/294, 276.2, 376.2
See application file for complete search history.

(56) References Cited

U.S. PATENT DOCUMENTS

| 4,230,773 | A | * | 10/1980 | Bakos | 428/447 |
|---|---|---|---|---|---|
| 5,028,566 | A | * | 7/1991 | Lagendijk | 438/784 |
| 5,045,504 | A | | 9/1991 | Gualandris et al. | 437/235 |
| 5,219,774 | A | * | 6/1993 | Vasche | 438/594 |
| 5,374,564 | A | | 12/1994 | Bruel | 437/966 |
| 5,486,267 | A | * | 1/1996 | Knight et al. | 438/694 |
| 5,491,104 | A | * | 2/1996 | Lee et al. | 438/254 |
| 5,849,644 | A | | 12/1998 | Schuegraf | 438/790 |
| 5,869,406 | A | | 2/1999 | Su et al. | 438/789 |
| 5,888,910 | A | | 3/1999 | Park | 438/783 |
| 5,933,739 | A | * | 8/1999 | Lin | 438/301 |
| 5,952,771 | A | * | 9/1999 | Zhang | 313/309 |
| 6,218,315 | B1 | | 4/2001 | Ballamine et al. | 438/778 |
| 6,232,234 | B1 | * | 5/2001 | Yao et al. | 438/714 |
| 6,281,140 | B1 | * | 8/2001 | Chen et al. | 438/763 |
| 6,858,537 | B2 | * | 2/2005 | Brewer | 438/692 |
| 7,446,019 | B2 | * | 11/2008 | Daval et al. | 438/459 |
| 2009/0023267 | A1 | * | 1/2009 | Daval et al. | 438/406 |

FOREIGN PATENT DOCUMENTS

| EP | 0 360 992 B1 | 8/1994 |
|---|---|---|
| JP | 08255791 A * | 10/1996 |
| WO | WO 03/063214 A2 | 7/2003 |

OTHER PUBLICATIONS

Pun, A.F., et al., "A method for reducing surface roughness during the thermal desorption of silicon". Thin Solid Films, 504 (2006) pp. 136-139.*
Chinese Search Report for application No. 200480044013.3.

* cited by examiner

*Primary Examiner*—Bret Chen
(74) *Attorney, Agent, or Firm*—Winston & Strawn LLP

(57) ABSTRACT

The invention relates to a of manufacturing a silicon dioxide layer of low roughness, that includes depositing a layer of silicon dioxide over a substrate by a low pressure chemical vapor deposition (LPCVD) process, the deposition process employing simultaneously a flow of tetraethylorthosilicate (TEOS) as the source material for the film deposition and a flow of a diluant gas that it not reactive with TEOS, so that the diluant gas/TEOS flow ratio is between 0.5 and 100; and annealing the silicon dioxide layer at a temperature between 600° C. and 1200° C., for a duration between 10 minutes and 6 hours.

20 Claims, 2 Drawing Sheets

METHOD OF MANUFACTURING A SILICON DIOXIDE LAYER

CROSS-REFERENCE TO RELATED APPLICATIONS

This application is a continuation of International application PCT/EP2004/011616 filed Sep. 16, 2004, the entire content of which is expressly incorporated herein by reference thereto.

BACKGROUND ART

The invention relates to a method of manufacturing a silicon dioxide layer of low roughness deposited on a substrate and to a method of manufacturing a composite substrate or wafer including such silicon dioxide layer as buried layer, in particular for applications in the fields of optics, optoelectronics or electronics.

FIGS. 1A to 1E illustrate the different steps of a prior art process employed for manufacturing such a composite substrate.

As can be seen on FIG. 1A, a silicon dioxide layer 2 is firstly deposited on a bulk substrate 1 termed the "source substrate", because it is used to provide the material that will constitute later the top layer of the composite substrate. In view of the kind of composite substrate aimed to be obtained, such source substrate may be, for example, a material such as silicon, silicon germanium, strained silicon or germanium.

Among the different techniques used to realize the deposition of the silicon dioxide layer 2, one is known to the skilled person under the acronym "LPCVD TEOS" which means "Low Pressure Chemical Vapour Deposition" of silicon oxide films using "tetraethylorthosilicate" as the source material. Such deposition is carried out by introducing a substrate or a batch of substrates 1 inside a LPCVD reactor and by exposing the substrates in the reactor to tetraethylorthosilicate, the chemical formula of which is $Si(OC_2H_5)_4$, as the source material for silicon oxide ($SiO_2$). This process provides certain advantages in terms of uniformity or density of the oxide layer obtained as compared to other oxide deposition process such as low temperature or high temperature deposition processes. Then, the dioxide layer 2 thus obtained is submitted to a thermal annealing, in order to improve its structural and electrical properties.

Layers deposited with TEOS have a significantly higher surface roughness than thermally grown layers. Consequently, an additional chemical mechanical polishing (CMP) step is required to smooth the free surface of the silicon dioxide layer 2, before bonding it with another substrate. To do so, one uses a polishing head h (as can be seen in FIG. 1B) with an abrasive paste or liquid.

Next, as seen in FIG. 1C, a zone of weakness 10 is created inside the source substrate 1 by implanting atomic species. The term "atomic species implantation" means any bombardment of molecular or ionic, atomic species which is capable of introducing such species into the material of the source substrate 1, with a maximum concentration of the species located at a given depth from the bombarded surface which depth in the present case is preferably larger than the thickness of the silicon dioxide layer 2. The molecular, ionic or atomic species are introduced into the material with an energy that is also distributed about a maximum.

Implantation of atomic species into the source substrate 1 can be carried out, for example, using an ion beam implanter or a plasma implanter. Preferably, the implantation is carried out by ionic bombardment. More preferably, the implanted ionic species is hydrogen. Other ionic species can advantageously be used alone or in combination with hydrogen, such as ions of rare gases (for example and preferably helium).

A zone of weakness 10 marks the boundary between two portions, namely a thin top layer 11 and the remainder 12 of the substrate. By way of example, reference can be made to the literature concerning the layer transfer method known under the trade name SMART-CUT®. A support substrate 3 is then bonded by molecular bonding to the free surface of the silicon dioxide layer 2 (see FIG. 1D).

Finally, as can be seen in FIG. 1E, the remainder 12 is detached from the source substrate 1, along the zone of weakness 10, to keep only the top layer 11 on the silicon dioxide layer 2 and the support substrate 3. Concerning the detachment, one of the following techniques can be used, either alone or in combination: application of stresses of mechanical or electrical origin, chemical etching or supplying energy (laser, microwaves, inductive heating, and furnace treatment). These detachment techniques are known to the skilled person and will not be described here in further detail. The composite substrate thus obtained is referenced 4.

In the above-mentioned process, the polishing step of FIG. 1B presents numerous drawbacks such as the lack of uniformity of the resulting layer 2, the lack of reproducibility of the process and the low throughput of the process. Further, this additional step increases the manufacturing cost of each substrate or wafer. Thus, there is a need for improvements in this portion of the process.

SUMMARY OF THE INVENTION

The present invention now overcome the above-mentioned drawbacks and in particular eliminates the use of chemical and mechanical polishing. Consequently, the invention aims to improve the LPCVD TEOS deposition process, in order to obtain a high quality silicon dioxide layer 2 which meets substrate direct bonding criteria in terms of surface roughness, uniformity and particle density and which can be used as buried oxide layer. In addition, the invention also provides an interface with superior electrical features.

To this end, the invention provides a method of manufacturing a silicon dioxide layer of low roughness. This method includes depositing a layer of silicon dioxide upon the substrate using a low pressure chemical vapour deposition (LPCVD) process, wherein the layer is deposited employing simultaneously a flow of tetraethylorthosilicate (TEOS) as the source material for the film deposition and a flow of a diluent gas that is not reactive with TEOS, with the diluent gas and TEOS being present in the flow at a diluent gas/TEOS ratio of between about 0.5 and 100; and annealing the silicon dioxide layer at a temperature between about 600° C. and 1200° C. for a duration between about 10 minutes and 6 hours. The method thus reduces surface roughness of the silicon dioxide layer when depositing the same on a substrate compared to silicon dioxide layers provided from TEOS alone or at a different diluent gas/TEOS ratio.

Preferably, the diluent gas is choosen among nitrogen, argon (Ar), helium (He) and a mixture thereof, and the annealing is performed at a temperature between about 700° C. and 900° C. for a duration between about 1 and 4 hours. Advantageously, the annealing is carried out in an inert atmospheres comprising nitrogen, argon or helium or any mixture thereof.

The preferred diluent gas is nitrogen, and it is supplied with the TEOS at a nitrogen/TEOS ratio during the deposition process that is preferably between about 2 and 10, preferably between about 2.5 and 7, more preferably between about 3 and 6 and more preferably about 3.6. The deposition temperature is preferably between about 625° C. and 725° C., more preferably between about 650° C. and 700° C., most preferably about 675° C.

The deposition pressure is preferably between about 10 and 1000 Pa, more preferably between about 50 and 150 Pa, and most preferably is about 100 Pa. The TEOS flow is preferably between about 10 and 200 sccm, more preferably between about 50 and 90 sccm, most preferably about about 70 sccm, and the nitrogen flow is preferably between about 10 and 2000 sccm, more preferably between about 100 and 500 sccm and most preferably about 250 sccm. Advantageously, an oxygen flow is added to the nitrogen/TEOS mixture, the oxygen flow being between about 5 and 100 sccm, preferably between about 10 and 40 sccm, and more preferably about 25 sccm.

Preferably, the thickness of the silicon dioxide layer that is deposited is between about 10 and 400 nm.

The invention also provides a method of manufacturing a composite substrate with a buried silicon dioxide layer, in particular for applications in the fields of optics, optoelectronics or electronics. This method comprises:

depositing a silicon dioxide layer, on a first substrate termed the "source substrate", by the method disclosed above, implanting atomic species within the source substrate, to define therein a zone of weakness which demarcates a thin top layer from a remainder of the substrate, with the thin top layer being in contact with the silicon dioxide layer, directly bonding a second substrate termed the "support substrate" against the silicon dioxide layer, by molecular adhesion, detaching the remainder of the source substrate, along the zone of weakness, in order to obtain the composite substrate.

Advantageously, the source substrate is made of a material selected from silicon, germanium, silicon germanium (SiGe) or strained silicon.

BRIEF DESCRIPTION OF THE DRAWINGS

Other characteristics and advantages of the invention become apparent from the following description of the invention.

This description is made with reference to the accompanying drawings in which.

DETAILED DESCRIPTION OF THE PREFERRED EMBODIMENTS

Figure 1A:
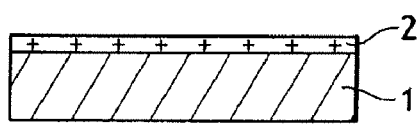
FIGS. 1A to 1E are diagrammatic representations of the different steps employed in the prior art method of manufacturing a composite substrate with a buried silicon dioxide layer.

According to the invention, the silicon dioxide deposition step of FIG. 1A is improved as mentioned above, but the method of the present invention.

It has now been discovered that the roughness of a silicon dioxide layer obtained by a "LPCVD TEOS" deposition process may be reduced by the use of a flow of a diluent gas simultaneously with a flow of TEOS during the deposition process. The diluent gas is preferably nitrogen but it can be any other gas that is not reactive with TEOS, of which argon (Ar) and helium (He) are non-limiting examples. Alternatively, any mixture of such non-reactive gases can be used.

The methods for determining the best operating conditions will now be described. Silicon dioxide deposition was performed by a low pressure vapour chemical deposition (LPVCD) process, which includes introducing a batch of source substrates inside the process chamber of a LPCVD reactor, and introducing gaseous flow of different chemical reactants, at elevated temperature, under low pressure, in order to form silicon dioxide layer as a result of chemical reaction between gaseous reactants. The reactor used in these trials was a vertical batch reactor, known under the trade mark of "A400", sold by the company ASM.

The gaseous reactants for this reactor were tetraethylorthosilicate (TEOS), oxygen, and in some cases nitrogen. TEOS is a relatively inert material, liquid at room temperature. TEOS vapour can be supplied to the process chamber of the reactor either from a bubbler using a carrier gas such as nitrogen or argon, or from a direct liquid injection system.

1) Comparative Processes.
a) Process A.

Three silicon dioxide layers have been manufactured respectively on three silicon substrates using the operating conditions mentioned below in Table 1.

TABLE 1

Process A Conditions

| Step name | Time (hh:mm:ss) | Temp (° C.) | $N_2$-flow (sccm) | TEOS flow (sccm) | $O_2$ flow (sccm) | Pressure (MTorr) |
| --- | --- | --- | --- | --- | --- | --- |
| Boat in | 0:10:00 | 650 | 1000 | — | — | atm |
| Pump | 0:15:30 | to 675 | — | — | — | — |
| Purge | 0:10:30 | 675 | 500 | — | — | 750 |
| Pump/Leakcheck | 0:07:20 | 675 | — | — | — | — |
| Stabilize | 0:30:00 | 675 | 500 | — | — | 750 |
| Pre-deposition | 0:05:00 | 675 | — | — | 100 | — |
| Deposition | 0:48:30 | 675 | — | 70 | 25 | 750 |
| Post-deposition | 0:05:00 | 675 | — | — | 100 | — |
| Pump/Purge | 0:15:00 | 675 | 500 | — | — | — |
| Backfill | 0:11:00 | to 650 | 5000 | — | — | to atm |
| Boat out | 0:10:00 | 650 | — | — | — | atm |

"atm" means "atmospheric pressure".
"sccm" means "standard cubic centimeters per minute".
750 m Torr is equivalent to 100 Pa.
The silicon dioxide layer is formed by the following chemical reaction:
$Si(OC_2H_5)_4$ (liquid) → $SiO_2$ (solid) + $4C_2H_4$ (gas) + $2H_2O$ (gas)

In this case, nitrogen is only used to purge the process chamber but is not present during the deposition step. The deposition process has been repeated in order to obtain silicon dioxide layers of different thicknesses. This process is referred to as Process A.

b) Process B.

Process A has been repeated using the operating conditions mentioned in Table 1, except that the deposition pressure was of 1200 mTorr (160 Pa) instead of 750 mTorr (100 Pa). This process is referred to as Process B.

c) Process C.

Process A has been repeated using the operating conditions mentioned in Table 1, except that the deposition temperature was of 635° C. instead of 675° C., and that the TEOS flow was 50 sccm instead of 70 sccm. This process is referred to as Process C.

2) Processes According to the Invention.

a) Process D.

The above-mentioned process has been repeated but with the operating conditions mentioned below in Table 2.

TABLE 2

Process D conditions

| Step name | Time (hh:mm:ss) | Temp (° C.) | $N_2$-flow (sccm) | TEOS flow (sccm) | $O_2$ flow (sccm) | Pressure (MTorr) |
|---|---|---|---|---|---|---|
| Boat in | 0:10:00 | 650 | 1000 | — | — | atm |
| Pump | 0:15:30 | to 675 | — | — | — | — |
| Purge | 0:10:30 | 675 | 500 | — | — | 750 |
| Pump/Leakcheck | 0:07:20 | 675 | — | — | — | — |
| Stabilize | 0:30:00 | 675 | 500 | — | — | 750 |
| Pre-deposition | 0:05:00 | 675 | 500 | — | 100 | — |
| Deposition | 0:49:00 | 675 | 500 | 70 | 25 | 750 |
| Post-deposition | 0:05:00 | 675 | 500 | — | 100 | — |
| Pump/Purge | 0:15:00 | 675 | 500 | — | — | — |
| Backfill | 0:11:00 | to 650 | 5000 | — | — | to atm |
| Boat out | 0:10:00 | 650 | — | — | — | atm |

"atm" means "atmospheric pressure".
"sccm" means "standard cubic centimeters per minute".
750 m Torr is equivalent to 100 Pa.
This process is referred to as Process D.

This process is referred to as Process D.

b) Process E.

Process D has been repeated but with a nitrogen flow of 250 sccm instead of 500 sccm. This process is referred to as Process E.

The main deposition parameters of the five above-mentioned processes are summarized below in Table 3.

TABLE 3

Comparison of TEOS deposition steps.

| Process name | Temp (° C.) | TEOS flow (sccm) | N2 flow (sccm) | O2 flow (sccm) | Pressure (Pa) | $N_2$/TEOS Ratio |
|---|---|---|---|---|---|---|
| Process A | 675 | 70 | 0 | 25 | 100 | 0 |
| Process B | 675 | 70 | 0 | 25 | 160 | 0 |
| Process C | 635 | 50 | 0 | 25 | 100 | 0 |
| Process D | 675 | 70 | 500 | 25 | 100 | 7.2 |
| Process E | 675 | 70 | 250 | 25 | 100 | 3.6 |

Then, the different silicon dioxide layers have been submitted to an annealing step, in nitrogen or argon, at atmospheric pressure, at a temperature between 700 and 900° C., during 1 to 4 hours. After densification of the silicon dioxide ($SiO_2$) layer obtained by the annealing step, the thickness of this $SiO_2$ layer has been measured by an ADE ACUMAP reflectometer.

Figure 2:
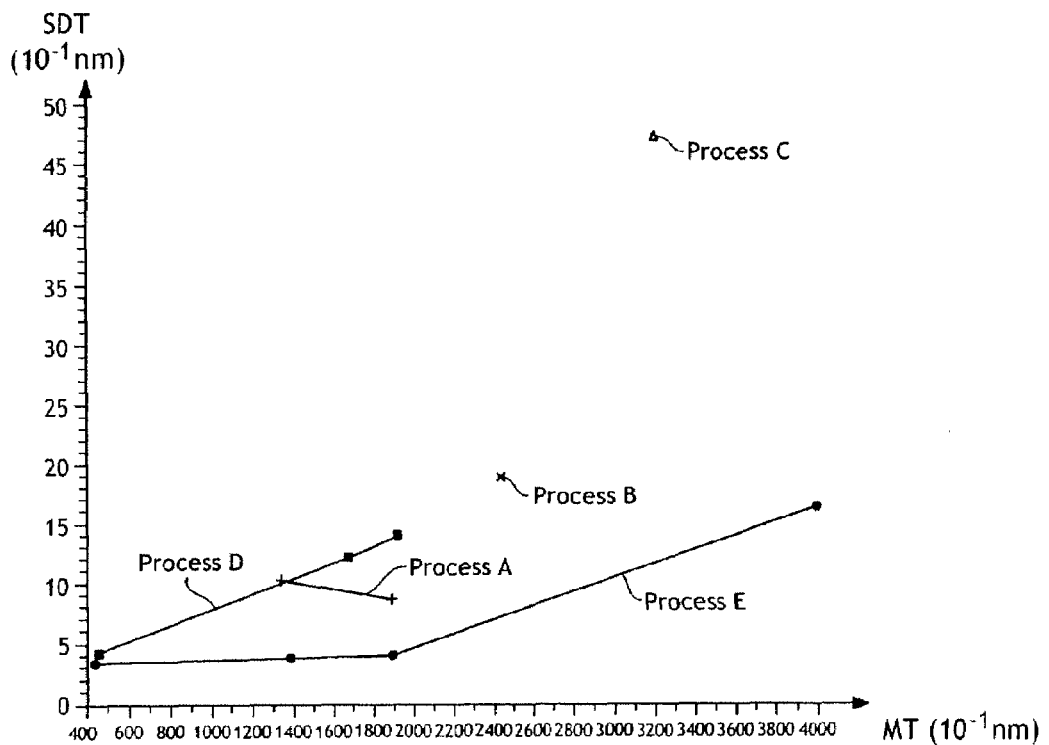
FIG. 2 is a graph showing the standard deviation of silicon dioxide layer thickness (SDT) as a function of the mean thickness value (MT) of the silicon dioxide layer, this latter being deposited according to various "LPCVD TEOS" processes, some of them corresponding to the invention and other to comparative processes.

The results are shown in FIG. 2. This graph represents the standard deviation of thickness (SDT) in angstroms (0.1 nm) of the $SiO_2$ layer after densification, versus the mean thickness after deposition (MT) in angstroms (0.1 nm), for the $SiO_2$ layers obtained by Processes A to E. As can be seen on FIG. 2, good results in term of thickness uniformity are obtained with Process D and better results are obtained with Process E, in particular for thicknesses below 200 nm.

Figure 3:
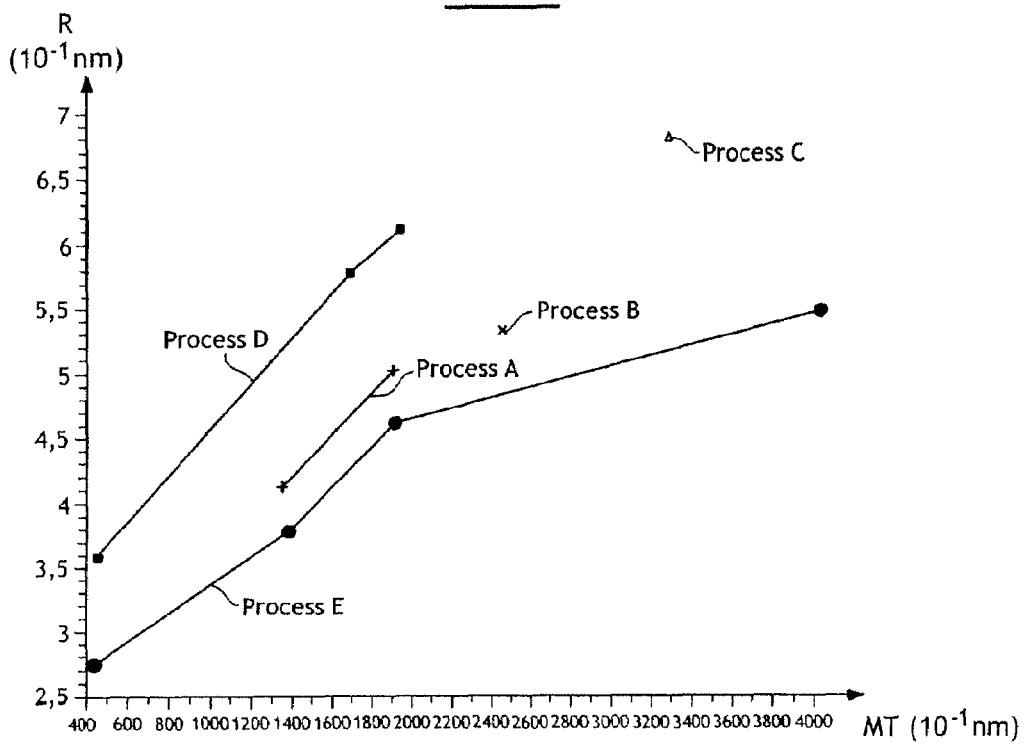
FIG. 3 is a graph showing the roughness (R) of the silicon dioxide layer as a function of the mean thickness value (MT) of the silicon dioxide layer, this latter being deposited according to various "LPCVD TEOS" processes, some of them corresponding to the invention and other to comparative processes.

Further, roughness measurements were performed by AFM technique for $1\times1$ $\mu m^2$ scan in the center of the different densified oxide layers. These results are shown in FIG. 3. This graph represents the roughness RMS value (R) in angstroms (0.1 nm) versus the mean thickness after deposition (MT) in angstroms (0.1 nm), for the $SiO_2$ layers obtained by Processes A to E. The aim of such roughness measurements is obviously to characterize the ability of the oxide layer to be directly bonded to the support substrate. The bonding is typically allowed by roughness below 0.55 nm. As can be seen in FIG. 3, the thicker the deposition is, the rougher it is. Nevertheless, at a given thickness, Process E gives the best results, i.e. the lowest roughness. Additionally, a plasma activation treatment of one or both of the surface(s) to be bonded may be achieved in order to further enhanced bonding energy.

Finally, the best operating conditions according to the process of the invention can be summarized as follows:

TEOS: preferably between 10 and 200 sccm, more preferably between 50 and 90 sccm, most preferably about 70 sccm.

Oxygen flow: preferably between 5 and 100 sccm, more preferably between 10 and 40 sccm, most preferably about 25 sccm.

Nitrogen flow: preferably between 10 and 2000 sccm, more preferably between 100 and 500 sccm, most preferably about 250 sccm, Ratio of nitrogen:tetraethylorthosilicate: preferably between 0.5 and 100, more preferably between 2 and 10, and most preferably around 3.6.

Deposition temperature: preferably between 625° C. and 725° C., more preferably between 650° C. and 700° C., most preferably about 675° C.

Deposition pressure: preferably between 10 and 1000 Pa, more preferably between 50 and 150 Pa, most preferably about 100 Pa.

Annealing conditions: preferably a temperature between 600° C. and 1200° C., for a duration between 10 minutes and 6 hours, more preferably a temperature between 700 and 900° C., for a duration between 1 and 4 hours.

Although the anneal is most simply carried out in an anneal furnace operating at atmospheric pressure, the anneal can also be carried out at a lower or higher pressure. Operating conditions within the range define above are dependant on specific deposition reactor conditions, as for instance reactor geometry and dimensions.

Further the anneal ambient appeared not to be very critical. Although inert anneal ambients such as nitrogen, argon or helium have the advantage that the substrate under the deposited oxide layer is not oxidized, it appeared that both anneals in an inert ambient, as well as anneals in oxidizing ambient such as air, or nitrogen/air mixtures, reduced the surface roughness of the films. It will be clear that in a manufacturing process an inert anneal ambient is preferred as oxidation of the underlying substrate during the anneal is undesirable.

Figure 1B:
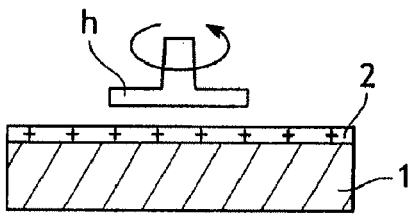
Figure 1C:
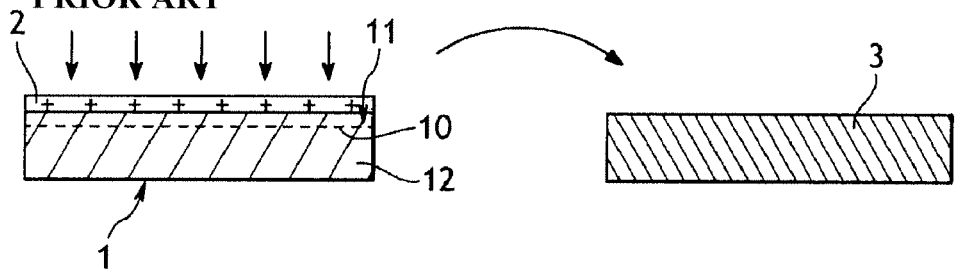
Figure 1D:
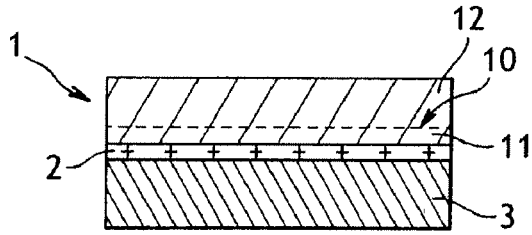
Figure 1E:
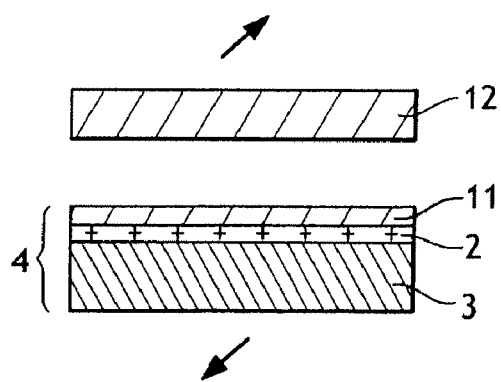

The invention also provides a method of manufacturing a composite substrate 4, as previously described with reference to FIGS. 1A to 1E but in which the step of LPCVD is realized according to the above described process. Further, the CMP prior art step of FIG. 1B is deleted.

By way of example, substrates known under the acronym "SOI", "SGOI", "sSOI" and "GOI" which mean respectively "silicon on insulator", "silicon germanium on insulator", "strained silicon on insulator" and "germanium on insulator" can thus be obtained, by using respectively silicon, silicon germanium, strained silicon and germanium as source substrate.

What is claimed is:

1. A method of manufacturing a composite substrate having a buried silicon dioxide layer which comprises:
    depositing a silicon dioxide layer on a source substrate by:
        depositing a layer of silicon dioxide upon the substrate using a low pressure chemical vapour deposition (LPCVD) process, wherein the layer is deposited employing simultaneously a flow of tetraethylorthosilicate (TEOS) as the source material for the film deposition and a flow of a diluent gas that is not reactive with TEOS, with the diluent gas and TEOS being present in the flow at a diluent gas/TEOS ratio of between about 0.5 and 100; and
        annealing the silicon dioxide layer at a temperature between about 600° C. and 1200° C., for a duration between about 10 minutes and 6 hours to reduce surface roughness compared to silicon dioxide layers provided from TEOS alone or at a different diluent gas/TEOS ratio;
    implanting atomic species within the source substrate to define therein a zone of weakness which demarcates a thin top layer from a remainder of the substrate, with the thin top layer being in contact with the silicon dioxide layer;
    directly bonding a support substrate to the silicon dioxide layer by molecular adhesion,
    detaching the remainder of the source substrate along the zone of weakness to obtain the composite substrate.

2. The method according to claim 1 wherein source substrate comprises silicon, germanium, silicon germanium or strained silicon.

3. The method of claim 1, wherein the diluent gas is nitrogen, argon, helium or a mixture thereof.

4. The method of claim 1, wherein the annealing is performed at a temperature between about 700° C. and 900° C. for a duration between 1 and 4 hours.

5. The method of claim 1, wherein the annealing is carried out in an inert atmosphere comprising nitrogen, argon, helium or a mixture thereof.

6. The method of claim 1, wherein the dilute gas is nitrogen and the nitrogen/TEOS ratio during the deposition process is between about 2 and 10.

7. The method of claim 6 wherein the nitrogen/TEOS ratio during the deposition process is between about 3 and 4.

8. The method of claim 1, wherein the silicon dioxide layer is deposited at a temperature of between about 625° C. and 725° C.

9. The method of claim 8, wherein the deposition temperature is between about 650° C. and 700° C.

10. The method of claim 9 wherein the diluent is nitrogen, the deposition temperature is about 675° C. and the nitrogen/TEOS ratio is about 3.6.

11. The method of claim 1, wherein the silicon dioxide layer is deposited at a deposition pressure of between about 10 and 1000 Pa.

12. The method of claim 11 wherein the deposition pressure is between about 50 and 150 Pa.

13. The method of claim 12 wherein the deposition pressure is about 100 Pa.

14. The method of claim 1, wherein the TEOS flow is between about 10 and 200 sccm, the diluent is nitrogen and the nitrogen flow is between about 10 and 2000 sccm.

15. The method of claim 14 wherein the TEOS flow is between about 50 and 90 sccm and the nitrogen flow is between about 100 and 500 sccm.

16. The method of claim 15 wherein the TEOS flow is about 70 sccm and the nitrogen flow is about 250 sccm.

17. The method of claim 14, which further comprises providing an oxygen flow with the nitrogen and TEOS flows, with the oxygen flow being between about 5 and 100 sccm.

18. The method of claim 17 wherein the oxygen flow is between about 10 and 40 sccm.

19. The method of claim 18 wherein the oxygen flow is about 25 sccm.

20. The method of claim 1, wherein the silicon dioxide layer is deposited at a thickness of between about 10 and 400 nm.

* * * * *

UNITED STATES PATENT AND TRADEMARK OFFICE
CERTIFICATE OF CORRECTION

| | |
|---|---|
| PATENT NO. | : 7,645,486 B2 |
| APPLICATION NO. | : 11/677696 |
| DATED | : January 12, 2010 |
| INVENTOR(S) | : Bourdelle et al. |

It is certified that error appears in the above-identified patent and that said Letters Patent is hereby corrected as shown below:

Title Page:
Item (56) References Cited, FOREIGN PATENT DOCUMENTS, after "EP 0 360 992 Bl" change "8/1994" to -- 4/1990 --.
Item (57) ABSTRACT, on line 1, after "The invention relates to a", insert -- method --; and on line 7, after "flow of a diluant gas that", change "it" to -- is --.

Signed and Sealed this

Sixteenth Day of February, 2010

David J. Kappos
*Director of the United States Patent and Trademark Office*